(12) United States Patent
Helfer et al.

(10) Patent No.: US 12,227,902 B2
(45) Date of Patent: Feb. 18, 2025

(54) ELECTRICALLY CONDUCTIVE PAPER

(71) Applicant: KOPHA GmbH, Dachau (DE)

(72) Inventors: Peter Helfer, Dachau (DE); Walter Reichel, Mering (DE)

(73) Assignee: KOHPA GmbH, Dachau (DE)

( * ) Notice: Subject to any disclaimer, the term of this patent is extended or adjusted under 35 U.S.C. 154(b) by 228 days.

(21) Appl. No.: 17/918,854

(22) PCT Filed: Apr. 13, 2021

(86) PCT No.: PCT/EP2021/059544
§ 371 (c)(1),
(2) Date: Oct. 13, 2022

(87) PCT Pub. No.: WO2021/209440
PCT Pub. Date: Oct. 21, 2021

(65) Prior Publication Data
US 2023/0235511 A1    Jul. 27, 2023

(30) Foreign Application Priority Data
Apr. 15, 2020    (DE) .......................... 102020110254.2

(51) Int. Cl.
*D21H 21/14*      (2006.01)
*C09D 11/52*      (2014.01)
*D21H 27/00*      (2006.01)
(52) U.S. Cl.
CPC ............. *D21H 21/14* (2013.01); *C09D 11/52* (2013.01); *D21H 27/00* (2013.01)

(58) Field of Classification Search
CPC .................. D21H 21/14; D21H 27/00; H05K 2201/0218; H05K 2201/0221; H05K 1/0386; H05K 1/092; C09D 11/52
See application file for complete search history.

(56) References Cited

U.S. PATENT DOCUMENTS

| | | | | |
|---|---|---|---|---|
| 2,084,849 A * | 6/1937 | Lasker, Jr. | ........... | G06K 19/067 427/261 |
| 10,085,350 B2 * | 9/2018 | Maijala | .................... | B05B 1/30 |
| 11,987,717 B2 * | 5/2024 | Zhong | .................. | C09D 11/037 |
| 2006/0163744 A1 * | 7/2006 | Vanheusden | ...... | H01L 23/49883 257/E21.174 |
| 2015/0024119 A1 * | 1/2015 | Maijala | .................. | H05K 1/038 427/98.5 |
| 2022/0010160 A1 * | 1/2022 | Zhong | .................. | C09D 11/033 |
| 2023/0235511 A1 * | 7/2023 | Helfer | .................... | C09D 11/52 162/138 |

FOREIGN PATENT DOCUMENTS

| | | | | |
|---|---|---|---|---|
| EP | 2770104 A1 * | 8/2014 | ............. | D21H 13/50 |
| EP | 4136291 B1 * | 4/2024 | ............. | C09D 11/52 |
| ES | 2688706 T3 * | 11/2018 | ............... | B05B 1/30 |
| RU | 2517178 C2 * | 5/2014 | ........... | F24D 13/022 |
| WO | WO-03054808 A2 * | 7/2003 | ............. | B42D 25/29 |
| WO | WO-2021209440 A1 * | 10/2021 | ............. | C09D 11/52 |

* cited by examiner

*Primary Examiner* — Jose A Fortuna
(74) *Attorney, Agent, or Firm* — Douglas Denninger

(57) ABSTRACT

The present invention relates to an electrically conductive paper structure and a method for its production, as well as the use of the electrically conductive paper structure, for example as a heating element.

10 Claims, 3 Drawing Sheets

ELECTRICALLY CONDUCTIVE PAPER

The present invention relates to an electrically conductive paper structure and a method for its production, as well as the use of the electrically conductive paper structure, for example as a heating element.

Electrically conductive paper structures are known in the prior art. In particular, EP 2 770 104 A1 disclosed electrically conductive paper structures, wherein the paper structure has a mixture of fiber materials, chemical additives and residual moisture. The mixture of the fibrous materials comprises at least cellulose-containing fibrous materials and carbon fibers, in particular recycled carbon fibers. The mixing ratio of the fibrous materials is selected so that the specific resistance of the paper structure is in a range between $10^{-1}$ $\Omega$m and $10^{-6}$ $\Omega$m. Additional methods for making such electrically conductive paper structures are also disclosed in EP 2 848 234 A1.

In using such electrically conductive paper structures, electricity is passed through the paper structure via attached electrodes. The electrodes can be wires glued to the paper, or copper foils glued to the paper. Difficulties exist in attaching the electrodes to the paper with glue, including warping on the paper, and inconsistent heating. In particular, the wires, and adjacent paper regions heat up disproportionately compared to the other regions of the paper, i.e., hotspots are created. The use of copper foils glued to the paper as electrodes generally results in consistent heating across the paper structures, i.e., hotspots are generally avoided. Unfortunately, there are a number of disadvantages in using copper foils as the electrodes. The copper foils are glued to the surface of the paper and are therefore proud of the paper surface. The thickness of the paper structure is therefore increased in the regions where the copper foil electrodes are attached. This increase in thickness is detrimental to the paper, especially when forming a roll of the paper. The increase in thickness of the paper results in stress being formed between the thicker part of the paper (i.e., the region with the copper foil) and the thinner part of the paper, especially when large rolls of the paper are produced. This region of stress can result in deformation of the paper. In addition, bending or forming a role of the paper can lead to partial detachment of the copper foil from the paper, which can then lead to inconsistent heating across the paper because there is variability in the level of contact between the copper foil and the paper. It is also noted that the cost of attaching copper foils to the paper is relatively high.

Electrically conducting inks are known. In particular, Bectron®, DuPont® and Dycotec produce electrically conducting inks. The inks are used to print electrical circuits on the surface of a variety of substrates. Accordingly, the inks are proud of the surface on which they are formed.

There is a need for electrically conductive paper having electrodes formed thereon and improved method of forming electrodes on.

One aspect of the present invention is an electrically conductive paper structure having electrodes formed from an electrically conducting ink, wherein the ink is substantially absorbed into the electrically conductive paper structure so that there is no substantial increase in the thickness of the paper.

The electrically conductive paper structure can be any electrically conductive paper structure, including those defined in EP 2 770 104 A1. The electrically defined paper structure comprises at least cellulose-containing fibrous materials and carbon fibers.

The mixing ratio of the fibrous materials may be selected so that the specific resistance of the paper structure is in a range between $10^{-1}$ $\Omega$m and $10^{-6}$ $\Omega$m. The resistance values can be measured using an LCR measuring device from Hewlett Packard, wherein measuring voltage for determining the resistance is 3 V, and the measuring cell had a circular centre contact and a ring-shaped external contact at a uniform distance of 1 cm from the centre. Other suitable methods for measuring resistance values are well known to those skilled in the art.

The paper in certain desired embodiments has an air permeability of between about 50 and 300 l/m²/s. In certain embodiments the air permeability is between about 70 and 150 l/m²/s, and in particularly desirable embodiments is about 95±15 l/m²/s. The air permeability can be measured using any suitable technique known to those skilled in the art, e.g., DIN 53887 and equivalent techniques. One option for measuring the air permeability is to use the FX 3300 LabAir IV system available from Textest AG; however, as will be appreciated by those skilled in the art, other equivalent systems can be used.

The electrically conductive paper structure may comprise one or more suitable chemical additives. Such additives may be selected from retention agents, drainage aids, retention aid dual systems or microparticle systems, wet and dry strength agents, sizing agents, fillers and/or pigments. Particular additives include talc, titanium dioxide, aluminium hydroxide, bentonite, barium sulfate, calcium carbonate, kaolin, defoamers, deaerators, biocides, enzymes, bleaching aids, optical brighteners, dyes, shading dyes, contaminants, precipitants (fixing agents), wetting agents, pH regulators, water-soluble polymers, amine-containing polymers, polyethylenimine, pyrrolidine, polyamides, polyacrylamide, polyether-containing polymers, polyethylene oxide, polyethers, hydroxyl-containing polymers, starch, carboxymethyl cellulose, polyvinyl alcohol, charged polymers, cationic polymers, cationic starch, corn starch, potato starch, wheat starch, rice starch, polymers containing ammonium groups, anionic polymers, anionically modified polyacrylamides, sulfonated polymers, inorganic salts with high charge density, aluminium salts, aluminium (III) chlorides, aluminium sulfate, sodium aluminate, inorganic, charged particles/pigments, bentonite, montmorillonite, sodium silicate, wet strength agents, epichlorohydrin resins, glyoxal, zirconium salts, zirconium carbonate, combinations of anionic polymers and cationically modified pigments, and auxiliaries for reducing the flash point.

In a particular embodiment, the paper comprises a sizing agent. The sizing agent can be an internal sizing agent (added to the pulp prior to formation of the paper), or a surface sizing agent (applied to the surface of the paper). Suitable sizing agents include acrylic co-polymers (such as styrene acrylates), alkyl succinic anhydride (ASA), alkyl ketene dimer (AKD) and rosin. Numerous suitable sizing agents are well known to those skilled in the art.

In certain embodiments, the paper structure has a basis weight according to DIN EN ISO 536, which is in a range from 15 g/m² to 1,000 g/m², between 20 g/m² to 800 g/m², or between 20 g/m² and 300 g/m².

The paper structure also has, depending on the amount of carbon fibers used, a power consumption which is in the range from 50 W/m² to 5,000 W/m², in the range from 100 W/m² to 3,700 W/m², in the range from 100 W/m² to 1,000 W/m², and in particularly in the range from 250 W/m² to 750 W/m² and particularly preferred 150 W/m².

In use (i.e., when electricity is passed through the paper), a temperature in the range of 15° C. to 130° C., from 25° C.

to 100° C., or from 30° C. to 50° C., can be achieved on the surface of the paper structure.

The electrodes can be positioned at suitable locations to enable electricity to flow through the electrically conductive paper structure between the electrodes. The electrodes are sized to ensure that the electricity is uniformly dissipated into the paper to avoid any inconsistent heating, i.e., hotspots being created. In certain embodiments, the electrodes are between 1 and 50 mm wide. The electrodes are also, in certain embodiments, absorbed so that they are embedded within the paper to a depth of about 10 μm to 80 μm, 10 μm to 70 μm, 20 μm to 70 μm, preferably 50 μm to 70 μm. In other embodiments, the electrodes are absorbed so that they are embedded within the paper to a depth of about 10 μm to 60 μm, preferably about 20 to 50 μm.

The electrodes are therefore formed from a layer of the electrically conducting ink, wherein the layer is substantially embedded within the paper structure, i.e., the majority of the ink layer is located within the paper structure. The length of the electrodes will be generally determined by the size of the paper and the size of the region of the paper to be electrified. Often the length of the electrode will be the full length of the paper. It is desirable that each electrode is formed as a substantially solid unitary structure, so that the flow of electricity is consistent along the electrode.

The electrically conducting ink can be any electrically conducting ink. Electrically conducting inks are generally dispersions of electrically conducting particles, such as metals, carbon, and silicon. The electrically conducting particles may also be coated particles, wherein a metallic or non-metallic substrate is coated with an electrically conductive material, e.g., silver, copper, gold, aluminium, etc. In certain embodiments, the coated particles are coated with silver. Examples of such coated particles are available from Eckart GmbH, e.g., eConduct Copper (silver coated copper particles), eConduct Aluminium (silver coated aluminium particles) and eConduct Glass (silver coated glass particles). As will be appreciated by those skilled in the art, combinations of different electrically conducting particles can be used in the electrically conducting ink. Suitable inks include Bectron® CP6690, DuPont® Solamet PV410 and Dycotec DM-SIP-3061S, as well as inks including any of the coated particles recited above. On application to the paper, the electrically conducting ink has a viscosity that enables it to be substantially absorbed by the electrically conducting paper. Suitable viscosities of the ink on application include viscosities between about 1 and 100 Pa·s, and optionally between about 5 to 60 Pa·s. The viscosity can be measured using any suitable test, e.g., the plate-plate Beck test V18 at 100/s and at 23° C. In certain embodiments, the electrically conducting ink is solvent-free. It has been found that solvent-free inks have greater durability, especially when subjected to high temperatures, e.g., temperatures up to 160° C. High temperatures can be achieved during the printing process or while using the paper structure as a heating element.

As indicated above, the ink is substantially absorbed and thereby embedded into the paper structure resulting in a substantial part of the electrode being located within the paper structure itself. A substantial part of the ink being located within the paper is greater than 50% of the ink, preferably at least 75% of the ink and most preferably at least 90% of the ink being located within the paper. By ensuring that a substantial part of the ink is located and embedded within the paper, a greater contact area between the ink and the electrically conducting fibres within the paper is achieved. Such enhanced contact area between the ink and the electrically conducting fibres ensures that there is a strong and robust electrical connection and thereby reduces the risk of inconsistent heat being produced in the paper, i.e., hotspots being formed.

Furthermore, any increase in the thickness of the paper due to the presence of the ink is substantially avoided. As indicated above, there is no substantial increase in the thickness of the paper due to the presence of the electrodes. The term "no substantial increase in the thickness of the paper" as used herein means that any increase in the thickness of the paper due to the presence of the ink is less than 50 μm. In certain embodiments, any increase in the thickness of the paper is less than 30 μm, less than 25 μm, or less than 15 μm. In particular embodiments any increase in the thickness of the paper due to the presence of the ink is less than 15 μm. By ensuring that there is no substantial increase in the thickness of the paper, the paper can be formed into rolls without any substantial deformation of the paper.

The ink can be applied to the paper using any suitable printing technique. Suitable printing techniques include screen printing, pad printing, flexo printing, gravure printing, offset printing, 3D printing and inkjet printing. Such printing techniques are well known to those skilled in the art.

One skilled in the art will appreciate that the amount that the electrically conductive ink is absorbed into the paper can be controlled by adjusting one or more of the following: the air permeability (i.e., the porosity) of the paper; the paper sizing; the viscosity of the ink; the amount of ink applied; and the printing technique used. One skilled in the art can adjust these features to achieve a desirable level of ink absorption.

In particular, the ink is absorbed into the paper so that there is no substantial increase in the thickness of the paper due to the presence of the electrodes.

A further aspect of the present invention is a method of forming electrodes on an electrically conductive paper structure comprising printing electrically conductive ink on to electrically conductive paper, wherein the ink is substantially absorbed into the electrically conductive paper structure so that there is no substantial increase in the thickness of the paper.

As indicated above, the ink can be applied to the paper using any suitable printing technique. Suitable printing techniques include screen printing, pad printing, flexo printing, gravure printing, offset printing and inkjet printing. Other preferred application methods are spraying, painting, rolling and/or airbrushing. One skilled in the art would be able to apply the ink to the paper at a suitable viscosity so that the ink is substantially absorbed into the paper.

The ink is applied to the paper so that a sufficient amount of the electrically conducting particles (e.g., metal particles) is present to form the electrode. As indicated above, the ink is absorbed so that it is embedded within the paper to a depth of about 10 μm to 60 μm, preferably about 20 to 50 μm, or, in other embodiments, to a depth of 10 μm to 80 μm, preferably 50 μm to 70 μm. For example, when applying the electrically conducting inks, e.g., Bectron® CP6690, DuPont® Solamet PV410 or Dycotec DM-SIP-3061S, a coverage of at least 80 g/m² of the ink is desirable. In certain embodiments the coverage may be between about 80 and 150 g/m² or between 100 and 140 g/m².

A further aspect of the present invention is a method of using the electrically conductive paper disclosed herein as a heating element, wherein electricity is passed through the paper structure using the electrodes in order to generate heat. In particular, the electrically conductive paper can be used as a heating element in floors, walls, wallpapers, containers, fabrics, clothing, table tops, heating plates, heating mats and car interiors, e.g., as door, seat and dashboard heaters).

The paper structure disclosed herein can be produced relatively inexpensively. In particular, electrically conducting inks are relatively inexpensive and can be applied to the paper structure using known printing techniques.

Due to the flexibility of the material, almost any shape can be designed—as with normal paper. In addition, the electrodes can be located at any desired position, enabling the paper to have specific areas where heat is produced. The paper can be formed with a plurality of electrode pairs (anode and cathode pairs) so that different areas have different electrical flows compared to other areas. This enables areas of the paper to produce different levels of heat.

The electrically conductive paper structure can be electrified according to the invention. The electrification takes place, for example, with current, e.g., between 12 V and 400 V, especially low current between 24 V and 48 V, using direct or alternating current and causes the paper structure to heat up. As will be appreciated by those skilled in the art, the electrical connection with the electrodes formed on the electrically conductive paper can be achieved in any suitable manner, e.g, by using clamps, adhesive, etc.

Tests show that, for example, with 10-80% carbon fiber in the paper structure, and depending on the current consumption, a surface temperature between 15 and 90° C. can be reached. By applying a higher electric current, it is also possible to raise the surface temperature to over 100° C. If necessary, due to the flash point of paper, further measures may have to be taken to prevent the paper structure catching fire during operation as a heating element. For this purpose, for example, the paper structure can be equipped or treated with flame-retardant agents.

The paper structure disclosed herein retains the character of the paper and can be cut and sized to any desired shape. The paper remains smooth and can be laminated onto any solid surface, including stone, metal, wood, textiles, etc. The paper structure can be used as a heating element anywhere heat is desired. In addition, and as indicated above, by using a plurality of different electrode pairs, different areas of the paper structure can function as heating elements, and, if different electrical currents are applied, different levels of heat can be generated by the different areas.

The following examples are set forth as being representative of the present disclosure. These examples are not to be construed as limiting the scope of the present disclosure as these and other equivalent embodiments will be apparent in view of the present disclosure, Figures and accompanying claims.

FIG. 4 shows a microscope image of the surface of an electrically conductive paper on which an electrically conductive ink has been applied.

EXAMPLE 1

Figure 2:
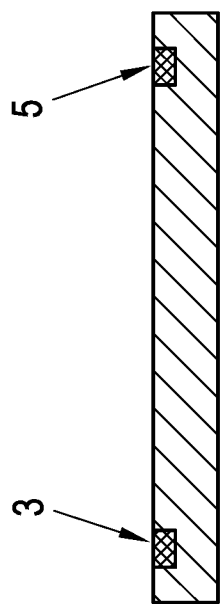
FIG. 2 shows a schematic image of a cross-section of the paper structure with the embedded electrodes.

Electrically conducting paper was made using the method disclosed in EP 2 770 104 A1. Electrically conducting paper from a number of different producers (S, W and A) was obtained.

Electrically conducting paper comprising 10% (w/w) of carbon fibers having an average length of about 5 mm, and a paper weight of 75 g/m$^2$, was obtained from three different producers, and is referred to as 10/05-75. The paper was sized by applying a styrene acrylate to the surface (on each side up and down wards) of the paper at a coverage of about 10 to 13 g/m$^2$. Electrically conducting ink (e.g., DuPont® Solamet PV410) was applied to the paper using screen printing in order to form strips 20 mm wide along opposing edges of the paper.

Copper foil electrodes were also attached to the same electrically conductive paper using an adhesive.

In order to determine the additional thickness caused by forming the different types of electrode on the electrically conducting paper, measurements were taken using a laser microscope. The result are the average of 10 measurements (5 times for the paper thickness in the absence of the electrode, and 5 times for the thickness of the paper including the electrode) taken for each different electrode structure. The measurement scatter was in each case in the 1/100 range. The results are shown in Table 1.

TABLE 1

| | values given as mm. | | | | | | |
|---|---|---|---|---|---|---|---|
| Test | 1 | 2 | 3 | 4 | 5 | Ø | Δ |
| Paper | 0.20 | 0.20 | 0.20 | 0.20 | 0.20 | 0.200 | |
| with copper foil | 0.32 | 0.27 | 0.30 | 0.29 | 0.29 | 0.294 | 0.094 |
| Paper-S | 0.17 | 0.18 | 0.19 | 0.18 | 0.18 | 0.180 | |
| with conducting ink | 0.19 | 0.20 | 0.19 | 0.18 | 0.19 | 0.190 | 0.010 |
| Paper-W | 0.25 | 0.26 | 0.25 | 0.25 | 0.26 | 0.254 | |
| with conducting ink | 0.28 | 0.27 | 0.28 | 0.28 | 0.28 | 0.278 | 0.024 |
| Paper-A | 0.19 | 0.19 | 0.19 | 0.19 | 0.18 | 0.188 | |
| with conducting ink | 0.19 | 0.20 | 0.20 | 0.20 | 0.20 | 0.198 | 0.010 |

The table shows that the use of copper foil electrodes increases the thickness of the paper by 0.095 mm, whereas the use of electrically conducting ink to form the electrodes increases the thickness of the paper by 0.024 mm or 0.01 mm.

A variety of different electrically conducting papers have also been produced with the electrodes formed from electrically conducting ink, and tested. The results are set out in Table 2. The paper is defined using the following nomenclature XX/YY-ZZ-Q, wherein:

XX indicates the percentage of carbon fibres present (w/w);

YY indicates the average length of the carbon fibres (mm);

ZZ indicates the weight of the paper (g/m$^2$); and

Q indicates the producer.

The results show that electrodes formed from the electrically conductive ink function effectively on a variety of papers.

TABLE 2

| Test | | 1.1 | 1.2 | 2.1 | 2.2 | 3.1 | 3.2 | 4.1 | 4.2 | 5.1 | 5.2 | 6.1 | 6.2 |
|---|---|---|---|---|---|---|---|---|---|---|---|---|---|
| Paper | | 10/05-75-S | 10/05-75-S | 10/10-90-S | 10/10-90-S | 35/10-90-S | 35/10-90-S | 35/10-90-W | 35/10-90-W | 10/05-80-W | 10/05-80-W | 10/05-75-A | 10/05-75-A |
| Specific electrical resistance | $\varrho$ ($\Omega*m*10^{-6}$) | 5.3 | 5.3 | 4.8 | 4.8 | 1.8 | 1.8 | 2.1 | 2.3 | 5.8 | 5.6 | 6.9 | 6.6 |
| Electrical resistance | R ($\Omega$) | 17.8 | 17.7 | 11 | 11 | 4.3 | 4.3 | 4.7 | 5.3 | 16.5 | 15.8 | 19.5 | 30.3 |
| Thickness | d ($m*10^{-3}$) | 0.18 | 0.18 | 0.26 | 0.26 | 0.25 | 0.25 | 0.25 | 0.25 | 0.2 | 0.2 | 0.2 | 0.2 |
| Length | l (m) | 0.25 | 0.25 | 0.25 | 0.25 | 0.25 | 0.25 | 0.296 | 0.296 | 0.296 | 0.296 | 0.296 | 0.182 |
| Width | w (m) | 0.15 | 0.15 | 0.15 | 0.15 | 0.15 | 0.15 | 0.167 | 0.167 | 0.167 | 0.167 | 0.168 | 0.168 |
| Resistance square | Rsq ($\Omega$) | 0.030 | 0.030 | 0.018 | 0.018 | 0.007 | 0.007 | 0.008 | 0.009 | 0.029 | 0.028 | 0.034 | 0.033 |
| Electri. conductivity | K ($S*m^{-1}$) | 187.27 | 188.32 | 209.79 | 209.79 | 558.14 | 558.14 | 480.16 | 425.80 | 170.97 | 178.54 | 145.53 | 152.32 |

Figure 3:
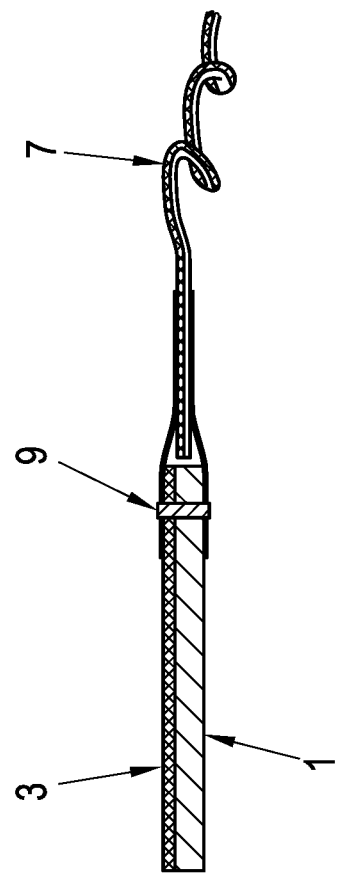
FIG. 3 shows a schematic image of a cross-section of the paper structure with an electrical connector attached to an electrode.
Figure 1:
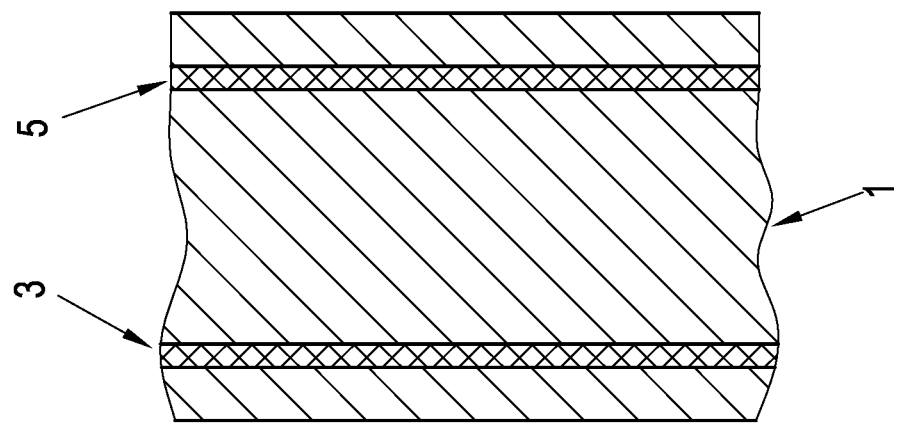
FIG. 1 shows a schematic image of a paper structure having electrodes formed from electrically conducting inks.

FIG. 1 shows a paper structure (1) having a first electrode (3) positioned on the left hand side of the paper structure, and a second electrode (5) positioned on the right hand side of the paper structure. FIG. 2 shows a section through the paper showing how the electrodes are embedded within the paper structure. FIG. 3 shows one way of connecting an electrode to an electrical source. In particular, an electrical cable (7) is connected using a clamp (9) which contacts one of the electrodes.

In one example, electrically conducting paper (type 10/05-75)—2 meters in length, 0.5 meters wide and 0.22 mm thick—has electrodes formed on opposing edges of the paper from electrically conducting ink, as described above. Electricity was then passed through the electrodes and heat generated. Details are as follows:

Voltage 12V, 54 Watts—$\Omega$ 2.67, temperature 5.5° C.
Voltage 24V, 216 Watts—$\Omega$ 2.67, temperature 22° C.
Voltage 32V, 384 Watts—$\Omega$ 2.67, temperature 38° C.
Voltage 48V, 864 Watts—$\Omega$ 2.67, temperature 86° C.

In each test the heat was generated in a consistent manner in the area of the paper between the electrodes, without any hotspots forming.

Figure 4A:
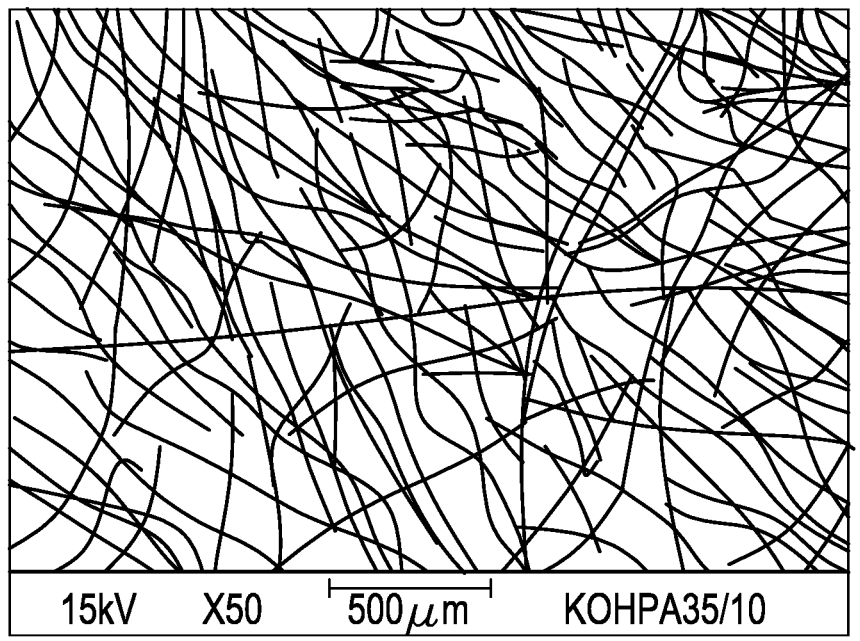
FIG. 4A is at 50× magnification.
Figure 4B:
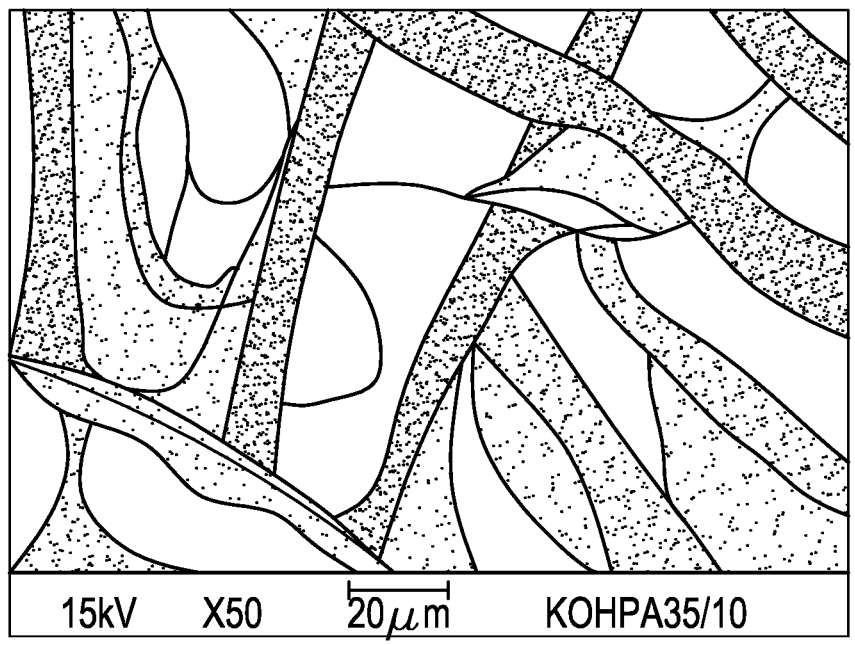
FIG. 4B is at 750× magnification.

Microscope images were taken of the paper having the electrically conducting ink electrodes. In FIGS. 4A and 4B the presence of the electrically conducting ink on the surface of the paper can be seen. As the underlying fibers of the paper can be seen, it is apparent that the layer of ink on the surface of the paper is very thin and does not in any significant way add to the thickness of the paper.

Figure 5:
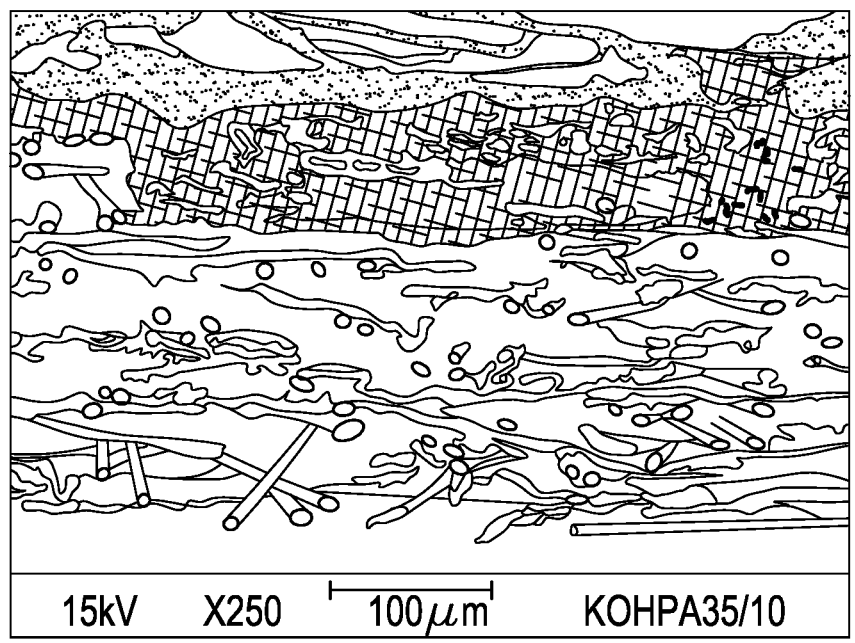
FIG. 5 shows a microscope image at 250× of a cut section of electrically conductive paper on which an electrically conductive ink has been applied.

In addition, a sectional view of the paper is shown in FIG. 5. It can be seen that the layer of electrically conducting ink penetrates the paper by about 40 μm (i.e., the ink has been substantially absorbed). It can further be seen that the fibers of the paper structure are embedded in the ink layer. A strong and robust connection between the ink and the fibers of the paper is therefore formed.

In contrast to the use of copper foils to form the electrodes, the use of the electrically conducting ink does not add significantly to the thickness of the paper, but still forms an electrode having substantially the same depth as the copper foil electrodes, i.e., a depth of about 30 μm to 40 μm. Accordingly, the electrodes function to provide consistent heat distribution across the paper because they are of sufficient size and have excellent connections with the carbon fibers present within the paper structure. In particular, there is no overheating of the material due to different "contact quality" at the contact edges, and no hotspots at the terminals because the applied energy is evenly dissipated due to the numerous contact points between the electrode ink layer and the carbon fibers.

In addition, the electrodes will not become detached from the paper even if bent because the ink layer is embedded within the paper. In addition, rolls of the paper in large diameter can be produced without any noticeable deformation of the paper as there is no substantial increase in the thickness of the paper caused by the presence of the electrodes.

The use of an electrically conducting ink to form the electrodes also enables simple cutting of the individual heating tracks from the parent roll. In addition, no additional covering layer or fixing of the electrodes is necessary. The paper structure can therefore be quickly and efficiently produced.

It is also noted that at high humidity the copper foils corrode and the corrosion shows up as "dirt particles" in the paper structure. Such corrosion is avoided by the use of the electrically conducting ink electrodes.

Although the invention has been described above with reference to one or more preferred embodiments, it will be appreciated that various changes or modifications may be made without departing from the scope of the invention as defined in the appended claims.

The invention claimed is:

1. An electrically conductive paper structure comprising a paper structure having electrodes formed from an electrically conducting ink, wherein the ink is substantially absorbed into the paper structure so that there is no substantial increase in the thickness of the paper structure, wherein the increase in the thickness of the paper structure due to the presence of the ink is less than 50 μm, a substantial part of the ink being located within the paper structure is greater than 50% of the ink, and the electrodes are embedded within the paper structure to a depth of 10 μm to 80 μm.

2. The electrically conductive paper structure of claim 1, wherein the paper structure has an air permeability of between about 50 and 300 l/m$^2$/s.

3. The electrically conductive paper structure of claim 1, wherein the electrically conducting ink is solvent-free.

4. The electrically conductive paper structure of claim 1, wherein the electrodes are between 1 and 50 mm wide, and/or are embedded within the paper structure to a depth of 10 μm to 60 μm.

5. The electrically conductive paper structure of claim 1, wherein any increase in the thickness of the paper structure due to the presence of the electrically conducting ink is less than 15 μm.

6. A method of using electrically conductive paper structure, comprising selecting the electrically conductive paper structure according to claim 1 as a heating element, and passing electricity through the paper structure using the electrodes in order to generate heat.

7. A method of forming electrodes on an electrically conductive paper structure comprising selecting electrically conductive paper and printing electrically conductive ink onto the electrically conductive paper, wherein the ink is substantially absorbed into the electrically conductive paper structure so that there is no substantial increase in the thickness of the paper structure, wherein the increase in the thickness of the paper structure due to the presence of the ink is less than 50 μm, a substantial part of the ink being located within the paper structure is greater than 50% of the ink, and the electrodes are embedded within the paper structure to a depth of 10 μm to 80 μm.

8. The method of claim 7, wherein the ink is applied to the paper structure using one of the following printing techniques: screen printing; pad printing; flexo printing; gravure printing; 3D printing; and offset printing.

9. The method of claim 7, wherein the electrically conducting ink has a viscosity between 1 and 100 Pa·s.

10. The method of claim 7, wherein the electrically conducting ink has a viscosity between 5 to 60 Pa·s.

* * * * *